United States Patent
Watkins et al.

(10) Patent No.: US 7,640,476 B2
(45) Date of Patent: Dec. 29, 2009

(54) METHOD AND SYSTEM FOR AUTOMATED PATH DELAY TEST VECTOR GENERATION FROM FUNCTIONAL TESTS

(75) Inventors: Daniel Watkins, Saratoga, CA (US); Liang-chi Chen, Cupertino, CA (US)

(73) Assignee: Sun Microsystems Inc., Santa Clara, CA (US)

( * ) Notice: Subject to any disclaimer, the term of this patent is extended or adjusted under 35 U.S.C. 154(b) by 389 days.

(21) Appl. No.: 11/525,659

(22) Filed: Sep. 22, 2006

(65) Prior Publication Data
US 2008/0092004 A1    Apr. 17, 2008

(51) Int. Cl.
*G01R 31/28* (2006.01)
(52) U.S. Cl. ..................................... 714/738
(58) Field of Classification Search .............. 714/734, 714/738, 741
See application file for complete search history.

(56) References Cited

U.S. PATENT DOCUMENTS

| | | | | |
|---|---|---|---|---|
| 5,910,958 | A * | 6/1999 | Jay et al. ..................... | 714/738 |
| 6,148,425 | A * | 11/2000 | Bhawmik et al. ........... | 714/726 |
| 6,247,154 | B1 * | 6/2001 | Bushnell et al. ............. | 714/733 |
| 7,039,845 | B2 * | 5/2006 | Rearick et al. .............. | 714/738 |
| 7,139,955 | B2 * | 11/2006 | Rohrbaugh et al. ......... | 714/738 |
| 2005/0240887 | A1 * | 10/2005 | Rajski et al. ................. | 716/4 |
| 2007/0011543 | A1 * | 1/2007 | Yoshimura et al. .......... | 714/738 |

* cited by examiner

*Primary Examiner*—James C Kerveros
(74) *Attorney, Agent, or Firm*—Brooks Kushman P.C.

(57) ABSTRACT

Disclosed herein are methods and systems for generating test vectors for use in verification of a circuit design and for hardware testing on a fabricated circuit representative of the circuit design. The system and methods can systematically and automatically perform functional and structural testing on selected paths of the circuit design and, in turn, generate one or more test vectors to increase PDT test coverage using the results of the structural test on the selected path.

20 Claims, 6 Drawing Sheets

METHOD AND SYSTEM FOR AUTOMATED PATH DELAY TEST VECTOR GENERATION FROM FUNCTIONAL TESTS

TECHNICAL FIELD OF INVENTION

The present invention generally relates to integrated circuits, and more particularly, to the design and fabrication of integrated circuits.

BACKGROUND OF THE INVENTION

With the advancement of semiconductor fabrication processes circuit designs continue to grow in size and complexity. As such, the need for comprehensive verification and validation of a circuit design also increases.

Conventionally, the design of an integrated circuit relied on manual development of directed tests and large regressions to find non-compliances in a circuit design. Test plans consistent with test descriptions were used to write a large number of directed tests. These tests were created using a combination of tools and methodologies created by the engineers working on the design.

Recently, a number of business entities, such as Mentor Graphics of Wilsonville, Oreg. and Cadence Design Systems of San Jose, Calif. have developed and marketed a number of tools and methodologies for use in testing and verifying a design or to test a fabricated circuit to identify non-compliant portions therein.

The tools and methodologies provided by such entities provide functional test capabilities to verify the behavior of the circuit design or the fabricated circuit and can provide other test capabilities that include path delay test (PDT) and transition test (TT). PDT testing can identify faults caused by cumulative propagation delay of a combinational path that increases beyond some specified time duration, and TT testing can identify transition faults gross gate delay such as gates that are slow to rise or slow to fall.

PDT tests are well suited for use to test a representation of a design and for use to test a fabricated version of the design. However, the number of paths in a logic circuit is exponential with the number of lines. So PDT test vector generation can only be performed successfully on a small portion of paths. Accordingly, PDT test coverage for a circuit design and, in turn, a fabricated version of the circuit design is often less than sixty percent. As such, functional tests are executed by automatic test equipment (ATE) to increase the test coverage percentage to above sixty percent. However, functional test generation for an ATE is often time consuming, may or may not be at speed capable, and requires highly specialized pieces of capital equipment.

SUMMARY OF THE INVENTION

The present invention addresses the above-described limitations of testing a design of an integrated circuit and, in turn, testing of a fabricated representation of the circuit design. An approach is disclosed to increase PDT test coverage for a given circuit design. As taught by the present invention, PDT test vectors are generated from functional simulation of a representation of the circuit design avoiding the reliance on test point and test node access to the paths forming the circuit design.

In one embodiment of the present invention, a method for generating one or more test vectors is disclosed. The method includes the step of performing a functional test on a path having a primary input node and a primary output node. The path is selected from a representation of a circuit design. The method includes the step of performing a structural test on the selected path to detect a functional test state of the primary output node of the selected path, and generating a path delay test vector capable of providing path delay fault coverage for the selected path based on the detected state of the primary output node. The selected path can be free of path delay test coverage.

The method can include other steps that include, the step of performing path delay testing on the representation of the circuit design to identify one or more paths free of path delay test coverage. The method can also include the step of halting execution of the functional test at a node representative of the primary input node of the selected path. Other steps performable by the method include stepping execution of the functional test back one clock cycle after halting the execution of the functional test at the node representative of the primary input node of the selected path.

The method can include the step of generating a representation of the selected path, the representation providing information for identifying the primary input and output nodes of the path. Another step performable by the method includes the step of taking an action to confirm the selected path is free of path delay test coverage. Performance of the method can include the step of selecting the circuit design that the PDT tool algorithm can cover.

In another embodiment of the present invention, a system capable of simulating an operation of a logic circuit is disclosed. The system includes a display device for viewing by a user, an input device for use by the user, and a test vector generation facility for generating test vectors for testing an electrical characteristic of the logic circuit. The fault simulation facility is capable of determining if one or more paths from a start point to an end point of the logic circuit having time dependent test coverage The test vector generation facility is configured to generate test vectors for testing the electrical characteristic of at least one of the paths from the start point to the end point of the logic circuit free of time dependent test coverage.

The system can include a simulation facility for simulating a functional operation of the logic circuit. The simulation facility is capable of simulating a functional operation of paths from the start point to the end point of the logic circuit to identify undetected paths so the test vector generation facility can attempt to generate test vectors for the identified undetected paths.

The system can include a storage device in communication with a computational device of the system for holding a representation of the one or more paths. The storage device can be remote from a computational device of the system and is associated with a network. The representation of the logic circuit includes data and operations associated with the data. The data and the operations associated with the data can include an instance of an object class.

In one embodiment of the present invention, a computer readable medium holding computer readable instructions for performing a method for generating one or more test vectors is disclosed. The method includes the steps of executing a functional test on a path having a primary input node and a primary output node. The path is selected from a representation of a circuit design. The method includes the steps of executing a structural test on the selected path to detect a state of the primary output node of the selected path, and generating a path delay test vector capable of providing path delay fault coverage for the selected path based on the detected state of the primary output node.

The medium can hold instructions for performing the step of executing a number of path delay tests on the representation of the circuit design to identify one or more undetected paths. The medium can hold instructions to halt execution of the functional test at a node representative of the primary input node of the selected path. Additionally, the medium can hold instructions to step execution of the functional test back one clock cycle after halting the execution of the functional test at the node representative of the primary input node of the selected path.

The medium can also include instructions for performing the step of generating a representation of the selected path. The representation provides information for identifying the primary input and output nodes of the path. The medium can include instructions for performing the step of confirming the selected path is undetected. The medium can include instructions for performing the step of selecting the functional test to perform. The selected functional test has the capability to simulate the functional operation of the selected path.

BRIEF DESCRIPTION OF THE DRAWINGS

An illustrative embodiment of the present invention will be described below relative to the following drawings.

DETAILED DESCRIPTION

The illustrative embodiment of the present invention provides methods and a system to increase PDT test coverage for a circuit design and a fabricated representation of the integrated circuit. The methods and system generate PDT test vectors using functional tests (i.e., register transfer level (RTL) functional tests or simulation) and structural tests (i.e., tests that observe the state of internal signals at primary outputs or a sequential logic element). The methods and system disclosed herein can significantly increase PDT test coverage for a circuit design and hence, a fabricated version of the circuit design. Generation of PDT test vectors can be undertaken in an automated manner.

PDT test coverage may increase 30% or more are realizable by the use and performance of the methods and system disclosed herein. The 30% PDT test coverage increase is compared to the conventional methodology of generating PDT test vectors based on access to test nodes of the circuit design, which can limit PDT test coverage for a given circuit design to less than 60% PDT test coverage for test vectors based on existing tool algorithms. Accordingly, functional tests at the RTL level are relied upon to provide the balance of the PDT test coverage which, in turn, decreases test time and provides accounting for structural test coverage.

The methods and system of the present invention facilitate additional PDT test vector generation which, in turn, reduces test run time, and, if desired, decreases the reliance on automatic test equipment (ATE) to perform at speed test of a fabricated circuit design.

Before continuing with the discussion below it is first helpful to define a few terms as used herein.

As used herein, the term "path" refers to a path, a control path or a clock path.

As used herein, the term "functional test" refers to simulation of a circuit design based on RTL or netlist of gates.

As used herein, the term "structural test" refers to a test that can detect a fault on a circuit path by observing the state of internal signals at a primary output or a sequential logic element of the circuit design. Structural tests depend on the specific structure (gate types, interconnects, netlists) of the circuit design.

As used herein, the term "at speed" refers to tests that are applied at the circuit's rated clock speed rather than at a lower clock speed.

As used herein, the term "scan test" is a type of structural test.

Figure 1:
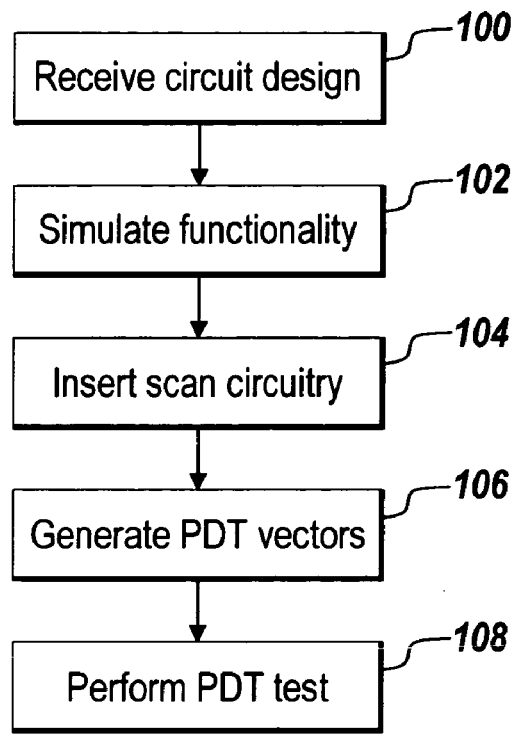
FIG. 1 is a block flow diagram illustrating the prior art steps taken to generate PDT test vectors.

FIG. 1 depicts prior art steps taken to generate and verify test vectors for PDT testing on a circuit design or a representation of the circuit design. In step 100, a circuit design or a representation of the circuit design is received by a user of a computational device or received by the computational device. Those skilled in the art will appreciate the circuit design or representation of the circuit design can be based on hardware description language (HDL), a kind of language used for the conceptual design of integrated circuits, examples are VHDL and Verilog. HDL description languages allow definition of a hardware model at the gate level, the register transfer level (RTL) or the page level using abstract data types.

In designing an integrated circuit with HDL code the HDL source code describes at some level the circuit element and an HDL compiler produces an RTL netlist. The RTL netlist corresponds to a schematic representation of circuit elements.

In step 102, using the RTL representation of the circuit design, a simulation or modeling of the circuit design is performed to verify the functionality of the various gates, interconnects in other elements forming the circuit design. This step is often referred to RTL simulation although netlist simulation is well suited for use with the teachings of the present invention.

In step 104, once the functionality of the circuit design is simulated and verified, the circuit design is modified by insertion of scan circuitry to add scan test capability to some or all of the paths that form the overall circuit design. Those skilled in the art will appreciate tools for insertion of scan circuitry are available from Mentor Graphics Company of Wilsonville, Oreg., USA.

In step 106, PDT test vectors are generated based on the modified circuit design that includes the inserted scan circuitry. Generation of the PDT test vectors in step 106 rely on design for test access path nodes or test points in the circuit design or representation of the circuit design and thus, PDT test coverage can be limited to less than 60% for a given circuit design. One suitable tool for generating PDT vectors using design path nodes and access points is FastScan available from Mentor Graphics Company of Wilsonville, Oreg., USA.

In step 108, structural timing analysis is performed on the circuit design or representation of the circuit design using the PDT test vectors generated.

Figure 2A:
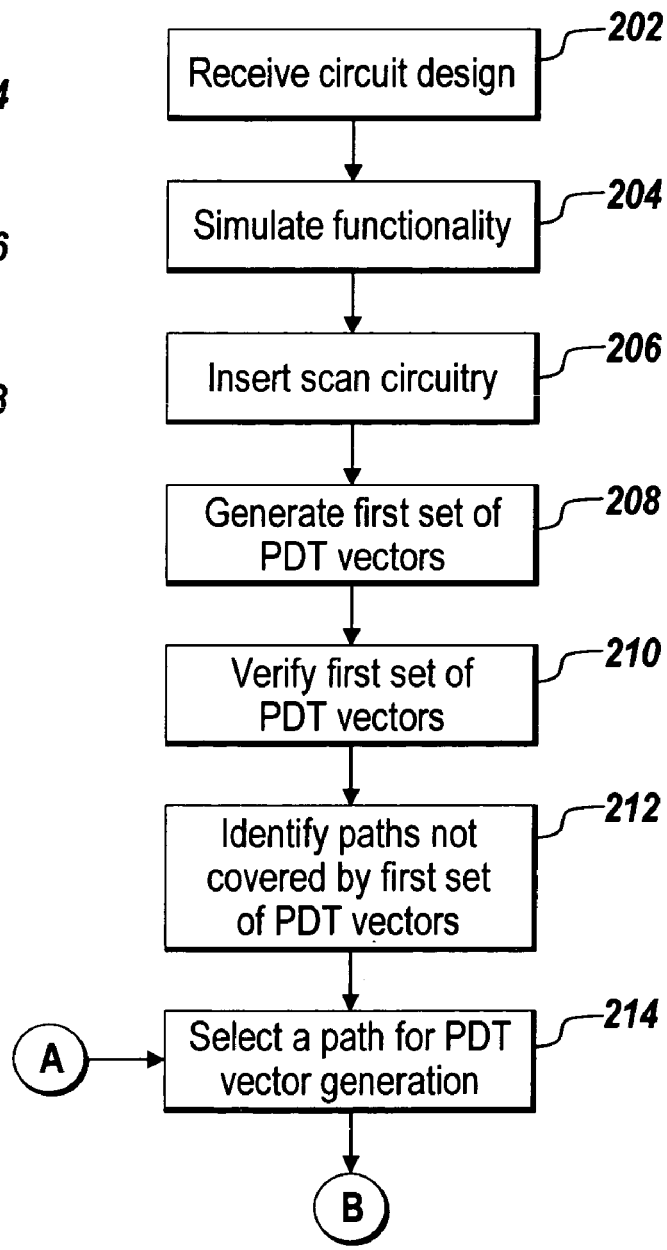
FIGS. 2A and 2B depict a flow chart illustrating exemplary steps taken to generate PDT test vectors in accordance with the teachings of the present invention.
Figure 2B:
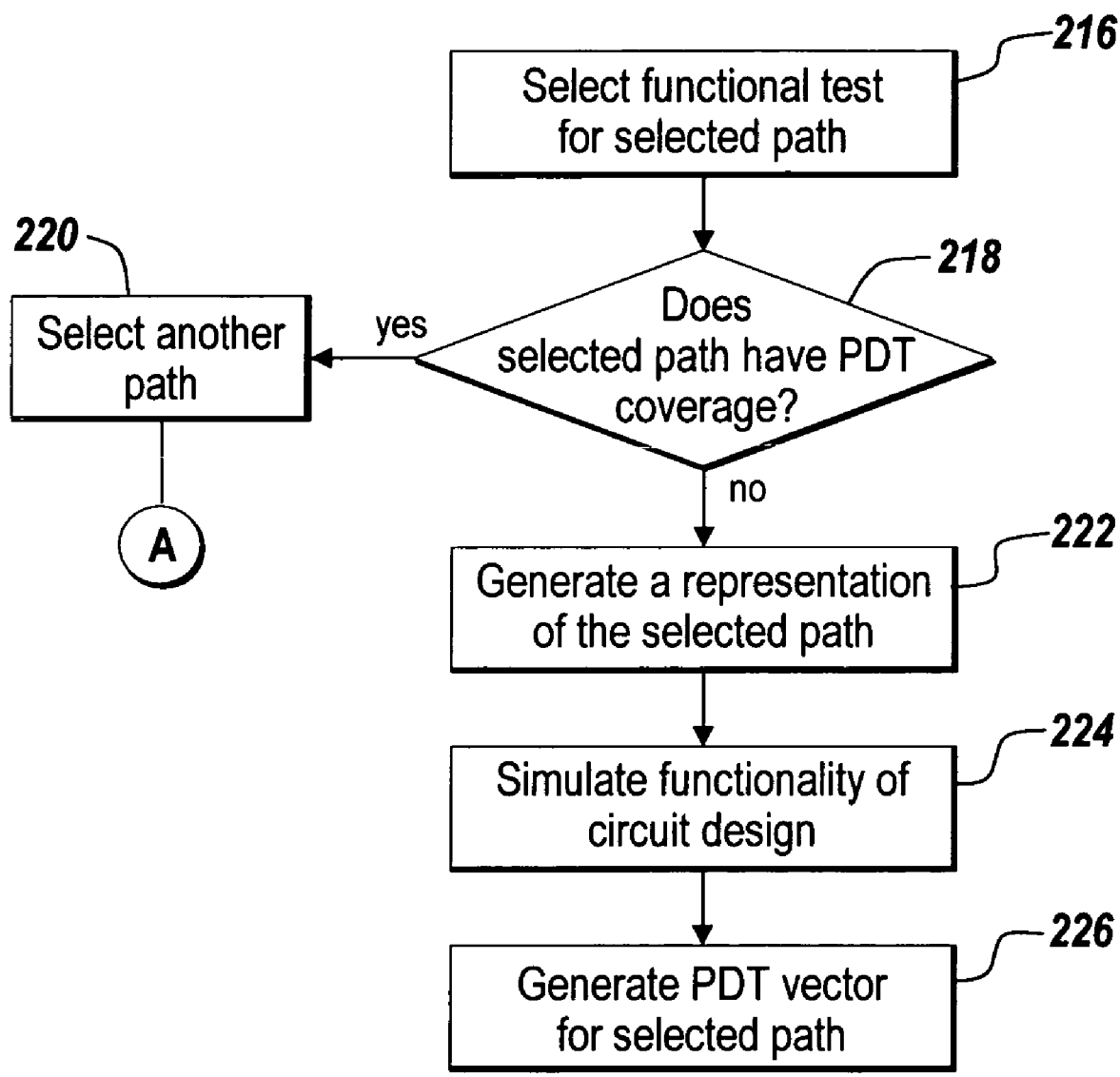

FIGS. 2A and 2B depict steps taken to practice an illustrative embodiment of the present invention to facilitate generation of PDT test vectors and increase the percentage of test coverage provided by PDT testing. FIGS. 2A and 2B are discussed below in relation to FIGS. 3-7.

Figure 7:
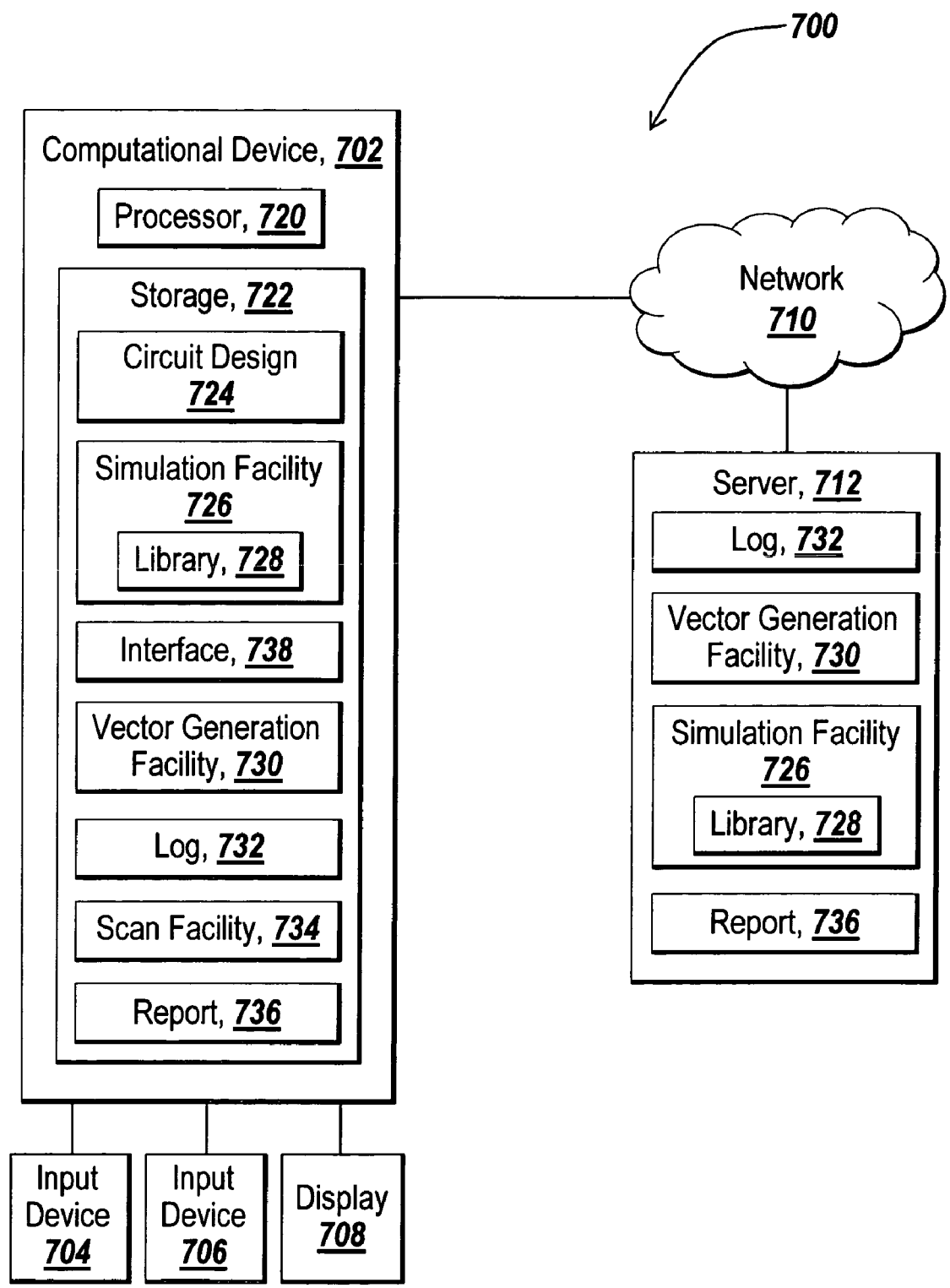
FIG. 7 illustrates a block diagram of a system suitable for use to generate PDT test vectors in accordance with the teachings of the present invention.

In step 202, the circuit design or representation of the circuit designed is received by, for example, a computational device such as the computational device 702 or the server 712 illustrated in FIG. 7. In step 204, a functional simulation or modeling of the circuit design is performed to confirm or verify the functionality of the design. One result of the functional simulation is a list or table of paths whose operational function was simulated. In step 206, scan circuitry is inserted into the circuit design to add scan capability to the design. Those skilled in the art will appreciate other processes and operations may be included as part of the above steps or added to the steps depicted in FIGS. 2A and 2B. For example, built in self test (BIST) circuitry can be inserted into the design and verified, design rule check (DRC) step can performed, along with other like methods and steps for processing electronic circuit designs for verification and for fabrication.

In step 208, a first set of PDT test vectors are generated by same method as step 106. In step 210, the first set of PDT vectors are verified and PDT testing is performed on the circuit design or representation of the circuit design. Those skilled in the art will appreciate that the steps 202-210 discussed above correspond to the steps 100-108 discussed above in relation to FIG. 1.

In step 212, an action is taken to identify the paths in the circuit design or representation of the circuit design free of PDT test coverage provided by the first set of PDT test vectors. The tool generating PDT vectors usually has the capability to identify the paths free of coverage from PDT test coverage The paths identified free of coverage from the first set of PDT test vectors can be logged to a log for use in generating additional PDT test vectors to provide additional PDT test coverage in accordance with the teachings of the present invention.

Figure 4:
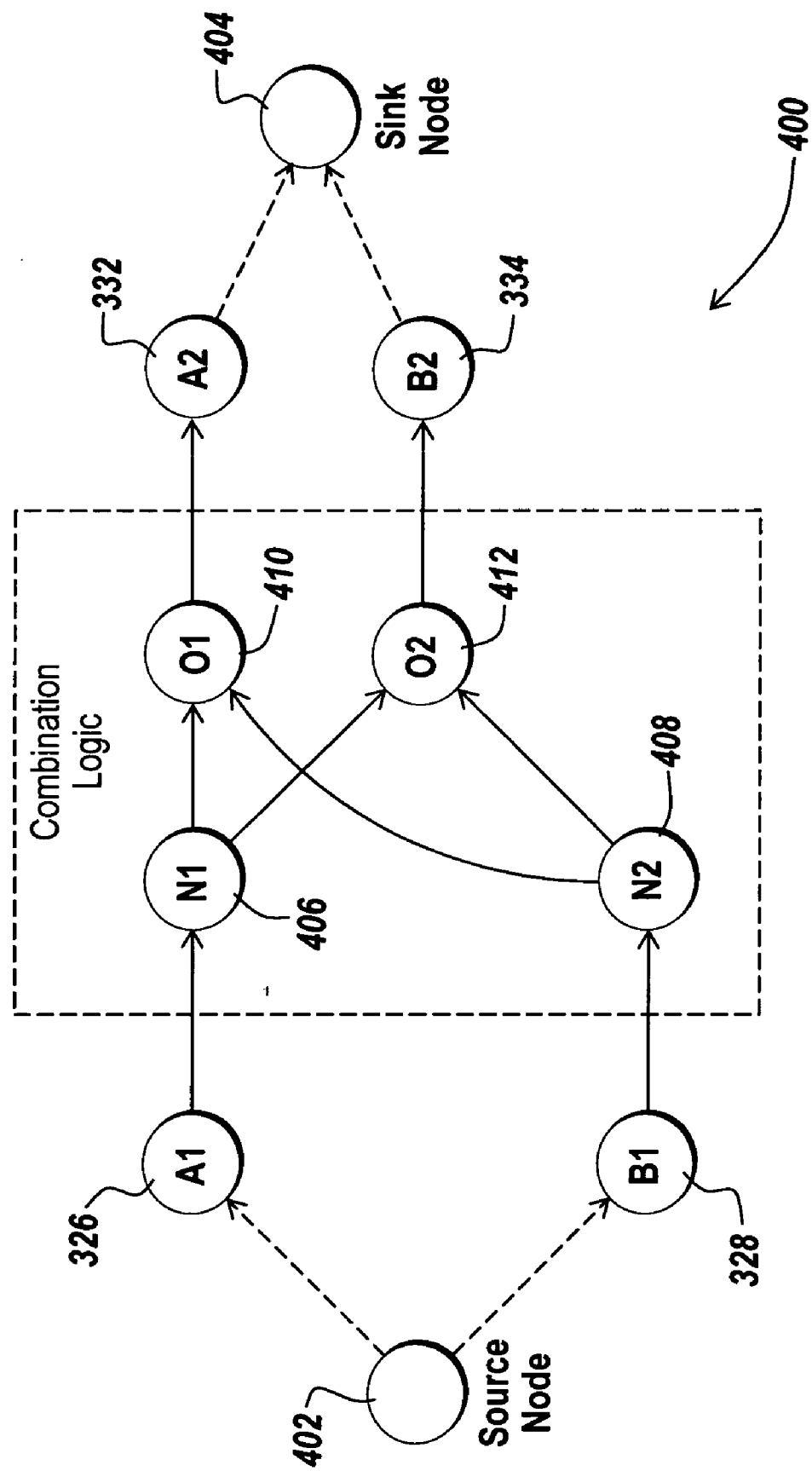
FIG. 4 is an exemplary graphical representation of the block diagram circuit representation illustrated in FIG. 3.

The paths free of PDT coverage from the first set of PDT test vectors and the paths with the PDT test coverage are identifiable from the netlist representation or the RTL representation of the circuit design by source node and sink node. FIG. 4, which is discussed below in more detail, provides one exemplary graphical path representation of a path having a source node and a sink node. In step 214, an overseer of the circuit design interested in increasing the PDT test coverage for the circuit design selects a PDT-undetected path One such facility is depicted in FIG. 7 and will be discussed in more detail below.

Those skilled in the art will appreciate, that the steps 212 and 214 are combinable so that the overseer can select a path for PDT test vector generation from a data structure that identifies one or more paths free of PDT test coverage from the first set of PDT test vectors or alternatively, the overseer can select a path and an action can be taken to compare the selected path to the paths having PDT test coverage from the first set of PDT test vectors. Those skilled in the art will also appreciate that although a path may have PDT test coverage from the first set of PDT vectors one or more PDT test vectors can be generated for the path in accordance with the teachings of the present invention.

Figure 5:
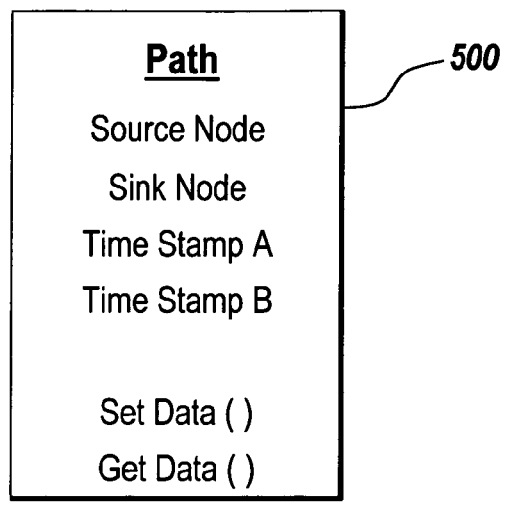
FIG. 5 depicts an exemplary object class suitable for use in accordance of the teachings of the present invention.

In step 216, the overseer of the test operation selects a functional test for the selected path. The functional test can be selected from a library of functional tests that simulate the operation of the selected path. In step 218, the computational device confirms the selected path is free of PDT test coverage from the first set of PDT test vectors. If in step 218, it is determined the selected path has coverage from the first set of PDT test vectors than, in step 220, the overseer can be prompted to select another path. If in step 218, it is determined the selected path is free of PDT coverage from the first set of PDT vectors the process continues to step 222. In step 222, the selected path is parsed and a representation of the selected path is generated. In an object oriented environment, an object can be defined for use in instantiating an object class that represents the selected path. One exemplary object class is illustrated in FIG. 5.

In step 224, the selected functional test is executed with the facility for identifying the PDT vector. The selected path is logged, in a log or an instance of a class object, the timestamp of the simulation when a vector is applied to the source node of the selected path and the timestamp when the simulation observes the vector value at the sink node of the selected path are also logged. In step 226, the test vector generation facility re-executes the functional test of the selected path and halts execution of the simulation at one clock cycle before the timestamp associated with the source node, loads a setup test state into the scan circuitry, issues an at speed clock pulse and performs a scan extraction on the selected path to detect a functional state of an output node of the selected path. Further, the test vector generation facility then advances execution of the simulation to the timestamp associated with the application of the functional vectors to the source node, issues an at speed clock pulse and performs a scan observation of the primary outputs or the sink node, and restarts execution at the sink node. In turn, the vector generation facility generates one or more PDT test vectors for the selected path from the observed states of the primary outputs or the source node of the selected path after each scan extraction. Further, the source node or primary inputs and the source node or primary outputs serve to from a template that identifies each launch point and capture point for the generated PDT test vector for the selected path. In this manner, some or all of the paths identified as free of PDT test coverage from the first set of PDT test vectors serve to form a second set of PDT test vectors from functional simulation of the circuit design or the representation of the circuit design.

The second set of PDT test vectors can be generated in an automatic manner once paths in the circuit design are identified and corresponding functional tests for the identified paths are selected and re-executed. Thus, PDT test coverage can be significantly increased over the conventional manner of PDT vector generation that relies on dedicated test generation tool algorithms. Hence, thefgg designated test points or test nodes in the circuit design or representation of the circuit design which, in turn, can facilitate hardware testing on a fabricated version of the circuit design that relies on dedicated test generation tool algorithms. Hence, the increase in PDT path coverage for the fabricated version of the circuit design can reduce manufacturing test time and thus reduce the cycle time associated with testing a fabricated version of the circuit design.

Figure 3:
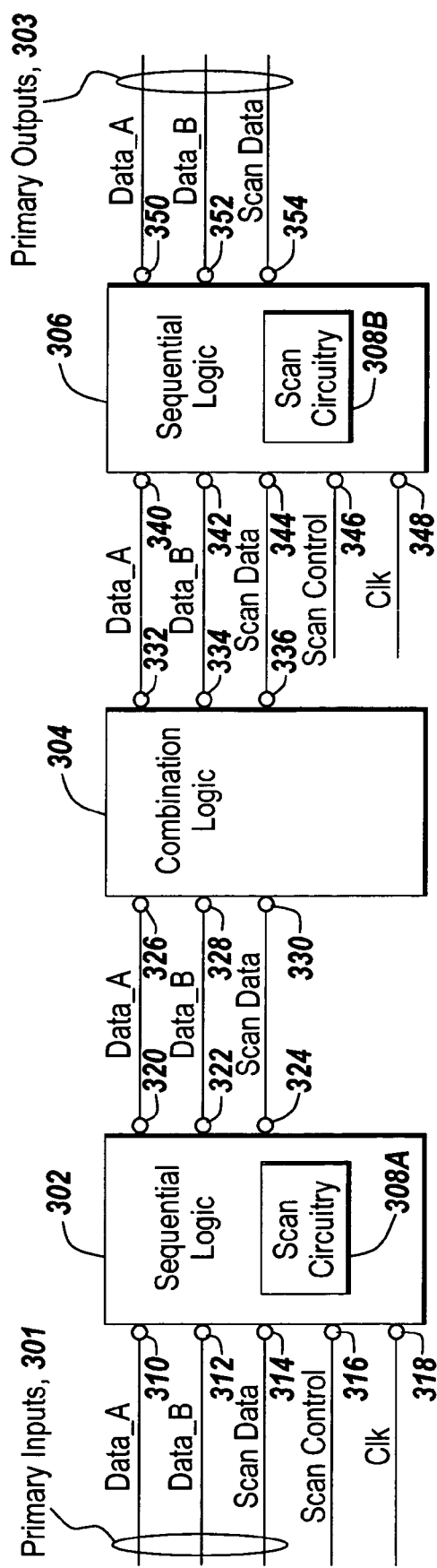
FIG. 3 is an exemplary block diagram representation of a path from which the present invention can generate PDT test vectors.

FIG. 3 represents an exemplary path of the circuit design. The path 300 includes primary inputs 301, sequential logic element 302, combinational logic element 304, sequential logic element 306 and primary outputs 303. The sequential logic element 302 includes scan circuitry 308A. Likewise, the sequential logic element 306 includes scanned circuitry 308B. Those skilled in the art will appreciate that the path 300 is exemplary and can represent any desired digital function or operation.

The sequential logic element 302 includes a first input node 310 to receive Data_A, a second input node 312 to receive Data_B and a third input node 314 to receive scan data. The first input node 310, the second input node 312 and the third input node 314 form the primary input nodes 301 of the path 300. The sequential logic element 302 includes a fourth input node 316 to receive a scan control signal and a fifth input node 318 to receive a clock. Further, the sequential logic element 302 includes a first output node 320 to assert Data_A1, a second output node 322 to assert Data_B1 and a third output node 324 to assert scan data from the scan circuitry 308A.

The combinational logic element 304 includes a first input node 326, a second input node 328 and a third input node 330. Each of the input nodes of the combinational logic element 304 are coupled to the sequential logic element 302. The first input node 326 receives the Data_A1 signal asserted by the sequential logic element 302. The second input node 328 receives the Data_B1 signal asserted by the sequential logic element 302. The third input node 330 receives the scan data signal asserted by the sequential logic element 302. Further, the combinational logic element 304 includes a first output node 332 to assert a Data_A2 signal, a second output node 334 to assert a Data_B2 signal and a third output node 336 to assert scan data.

The sequential logic element 306 includes a first input node 340, a second input node 342, a third input node 344, a fourth input node 346 and a fifth input node 348. The first input node 340, the second input node 342 and the third input node 344 are coupled to the combinational logic element 304. The first input node 340 receives the Data_A2 signal asserted by the combinational logic element 304. The second input node 342 receives the Data_B2 signal asserted by the combinational logic element 304. The third input node 344 receives the scan data asserted by the combinational logic element 304. The fourth input node 346 receives the scan control signal and the fifth input node 348 receives the clock. The sequential logic element 306 includes scan circuitry 308B for use in scanning and observing a state of the path 300. Further, the sequential logic element 306 includes a first output node 350, a second output node 352 and a third output node 354. The first output node 350, the second output node 352 and the third output node 354 form the primary outputs 303 of the path 300. The sequential logic element 306 assets the Data_A3 signal on the first input node 350, asserts the Data_B3 signal on the second output node 352 and asserts the scan data on the third output node 354.

FIG. 4 depicts an exemplary graphical representation of the path 300. The graphical representation 400 represents a signal flow graph of the combinational logic element 304. The signal flow graph 400 includes a source node 402 and a sink node 404. The source node 402 identifies the primary inputs 326 and 328 of the path 300 or the sequential logic element 302. In similar fashion, the sink node 404 identifies the primary outputs 332 and 334 of the path 300 of the sequential logic element 306. The combinational logic element 304 is graphically represented to include a first inverter 406, a second inverter 408, a first two input OR gate 410 and a second two input OR gate 412. Those skilled in the art will appreciate the representation of the combinational logic element 304 is illustrative and meant to facilitate explanation of the teachings of the present invention. The architecture of the combinational logic element 304 is configurable to any desired combinational logic architecture.

The first buffer 406 has an input coupled to the first primary input node 326 and an output coupled to a first input of the first OR gate 410 and to a first input of the second OR gate 412. The second inverter 408 as an input coupled to the second primary input node 328 and an output coupled to a second input of the first OR gate 410 and a second input of the second OR gate 412. In operation, the first inverter 406 and the second inverter 408 are logic elements that receive a single input and change it to its opposite state. The first OR gate 410 and the second OR gate 412 perform a logical OR operation on the outputs of the first inverter 406 and the second inverter 408 and each assert a result of the logical OR operation on the first primary output node 332 and the second primary output node 334, respectively.

FIG. 5 depicts an exemplary object class suitable for use by the vector generation facility 730 to identify a path free of PDT test coverage provided by the first set of PDT test vectors. The object class 500 defines a set of attributes and methods that characterize any member of the class, for example, an object. The class can have one or more subclasses, or child classes, that can inherit all or some of the characteristics of the class. In relation to each sub-class or child class, the class becomes the super class or parent class. Moreover, a sub-class can define its own characteristics that are not part of the super class.

Instantiation of an object of the class 500 represents a path, for example, the path represented by the signal flow graph 400 and includes the attributes "Source Node", "Sink Node", "Time Stamp A", and "Time Stamp B". Instantiation of the object class 500 also includes operations defined for setting data and getting data of a scan operation for the signal path having the identified source node and sink node. The time stamps identify to the vector generation facility when to halt execution of the functional test in order to load scan data and observe a state of the primary outputs of the selected path.

As discussed above in relation to FIGS. 2A and 2B the vector generation facility 17 of the present invention can generate a representation of the selected path by instantiation of an object of the class 500. Those skilled in the art will appreciate that the instantiation of an object to generate a representation of a selected path to generate a PDT vector is well suited for use in an object oriented environment. Nonetheless, the vector generation facility 730 of the present invention is well suited for use outside of an object oriented environment such as a structured programming environment or a programming environment having features of both a structured programming environment and an object oriented environment such as C#. Other suitable representations can include, but are not limited to a log entry that identifies the attributes of the selected path, and identifies when to perform and observe scan operations, or generation of an executable program that includes the attributes identified by the object class 500 and the procedures to call or perform structural testing of the selected path.

Figure 6:
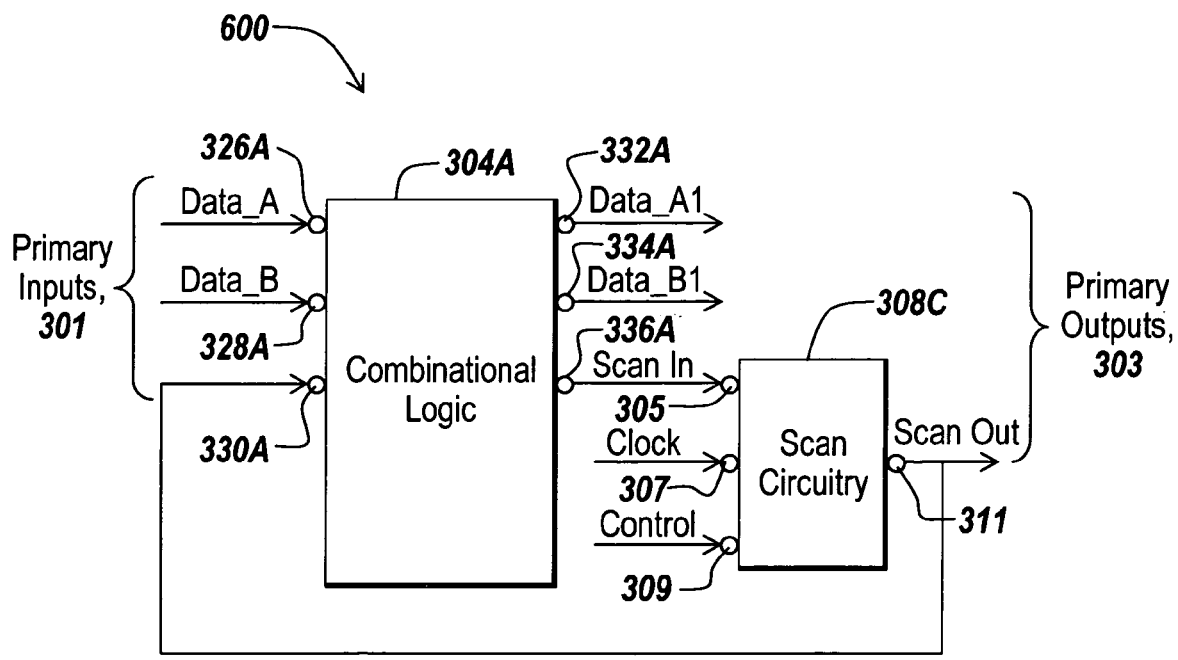
FIG. 6 depicts another exemplary circuit block diagram suitable for use in accordance with the teachings of the present invention.

FIG. 6 depicts another embodiment of a path suitable for use with the present invention. The path 600 includes one scan circuitry element 308C as compared to the two scan circuitry elements 308A and 308B of the path 300. The path 600 includes a combinational logic element 304A, and the scan circuitry element 308C. The combinational logic element 304A includes a first input node 326A to receive Data_A and second input node 328A to receive Data_B. The combinational logic element 304A includes a third input node 330A to receive scan data from the scan circuitry element 308C. The first input node 326A, the second input node 328A, and the third input node 330A define the primary inputs 301 of the path 600.

The combinational logic element 304A includes a first output node 332A to assert Data_A1 and a second output node 334A to assert Data_B1. The first output node 332A, the second output node 334A and output node 311 of the scan circuitry element 308C define the primary outputs 303 of the path 600. The combinational logic element 304A includes a third output node 336A to assert the scan data.

The scan circuitry element 308C includes a first input node 305 to receive the scan in data from the combinational logic element 304A, a second input node 307 to receive a clock, and a third input node 309 to receive a control signal. The scan circuitry element 308C includes the output node 311 which is coupled to the third input node 330A of the combinational logic element 304A. The scan circuitry element 308C asserts scan data on the output node 311.

Those skilled in the art will appreciate that as used herein scan tests refers to control and observeability for scan enhanced sequential logic elements that include circuitry (i.e., scan circuitry) to add a test mode to the circuit or the associated path such that when the circuit is in scan mode, all scan enhanced sequential logic elements functionally form one or more shift registers. Thus, using scan test, scan enhanced sequential elements can be sent to any desired state by shifting logic states into the shift register. Similarly, the states of the scan enhanced sequential logic elements are observed by shifting the contents of the scan register out. In this manner, all scan enhanced sequential logic elements can be set or observed in a time in terms of clock periods that equals the number of sequential logic elements in the longest scan register. In the discussion above and below a single scan register for each illustrated sequential logic element is identified, however, those skilled in the art will appreciate that in practice a design can have any number of scan enhanced sequential logic elements.

FIG. 7 illustrates an illustrative system suitable for practicing the present invention. The system 700 includes a computational device 702 coupled to a first input device 704, a second input device 706, to a display device 708, to network 710 and to server 712. The computational device 702 includes a microprocessor 720 for executing various instructions from an executable program and for controlling various hardware and software components. The computational device 702 communicates with the display device 708 for use in rendering textual and graphical images. The computational device 702 includes a storage device 722 for storing various items such as a circuit design 724, a simulation facility 726, a user interface 738, a vector generation facility 730, a log 732, a scan facility 734 and a report generator 736. Those skilled in the art will appreciate that the representation of the microprocessor 720 can take many different architectures and structures, for example, the microprocessor 720 can have multiple cores on a single die or can include multiple microprocessors on separate dies. The computational device 702 is coupled to the first input device 704, such as a keyboard to receive user input and coupled to the second input device 706 such as a pointing device or mouse, trackball, or lightpen to receive user input. The storage device 722 can also hold other various executable test programs, executable analysis programs and operating systems.

The vector generation facility 730 generates one or more test vectors for performance of PDT test on a selected path free of PDT test coverage provided by the first set of PDT vectors. The vector generation facility 730 receives as input information identifying the source node and the sink node of the selected path free of PDT test coverage or alternatively, primary input nodes and primary output nodes of the selected path free of PDT test coverage. The vector generation facility 730 also receives as input information regarding a representation of the circuit design such as a netlist or other like representation and also receives information identifying one or more points or locations in an executable functional simulation that represent the start of functional simulation of the selected path or a time just prior to the start of functional simulation of the selected path. In turn, the vector generation facility 730 using the received information coordinates execution of the functional simulation and coordinates scan operation and observeability of the selected path to generate one or more PDT test vectors for the selected path. The steps 212 through 226 discussed above in relation to FIGS. 2A and 2B provide further detail on the operation of the vector generation facility 730.

The simulation facility 726 is configured to perform a functional simulation on the circuit design 724 or a representation of the circuit design 724, such as a netlist or other like representation such as an RTL representation. The simulation facility 726 can include a library 728 that holds functional tests for use in verifying the functional operation of the circuit design 724. Those skilled in the art will appreciate the library 728 can be located outside of the simulation facility 726, for example, at a separate location in the storage device 722 or at a location in the server 712. The functional tests held in the library 728 are selectable by a user or overseer the circuit design. In this manner, the simulation facility 726 is informed of which functional test it should perform for the selected path.

The interface 738 allows a user or overseer to interact with the simulation facility 726, the vector generation facility 730 and the scan facility 734. Those skilled in the art will appreciate that the interface 738 can take the form of a graphical user interface that provides a user of a computational device 702 with textual and graphical information to allow the user to browse, select, create and modify test vectors held by the storage device 722 and to interact with the vector generation facility 730, the simulation facility 726, the scan facility 734, the log 732 and the report generator 736. Those skilled in the art will also appreciate that the interface 738 is also implementable as a command line interface or other suitable interface that allows the user to view and interact with the vector generation facility 730, the simulation facility 726, the scan facility 734, the log 732 or the report generator 736.

The log 732 can hold information identifying which paths of the circuit design 724 have PDT test coverage from a first set of PDT test vectors. Additionally, the log 732 can be used to hold information identifying which paths of the circuit design 724 the first set of PDT test vectors, and which The scan facility 734 is configured to insert or modify the circuit design 724 with scan circuitry and, if desired, to perform structural tests of the modified design using the inserted scan circuitry.

The report generator 736 is configurable to perform test coverage analysis of the circuit design 724 based on the first set of PDT test vectors generated using test points inserted into the circuit design 724 and generate a report identifying the paths having PDT test coverage from the first set of PDT test vectors. The report generator 736 is also configurable to perform identification of detected paths and test coverage analysis of the circuit design 724 after the generation of the first set of PDT test vectors and after generation of additional PDT test vectors in accordance with the teachings of the present invention.

The system 700 supports a distributed computing environment so that various tasks can be distributed amongst the server 712 and the computational device 702. In this manner, any number of users are able to access a simulation facility 726A, a vector generation facility 730A, a log 732A and a report generator 736A via the network 710 to generate one or more PDT test vectors for a selected path not detected by the first set of PDT test vectors.

The network 710 can be any network such as the Internet, an intranet, or other suitable network either wired or wireless or a hybrid of wired or wireless.

While the present invention has been described with reference to an illustrative embodiment thereof, one skilled in the art will appreciate that the changes in form and detail may be made without departing from the intended scope of the present invention as defined in the pending claims. For example, although discussed above in relation to test coverage for path delay faults generation of test vectors for detecting other delay faults such as transition faults, gate delay faults, line delay faults, segment delay faults are equally applicable. Although test vector generation is discussed herein in relation to a path free of PDT test coverage from the first set of PDT test vectors the methodologies and techniques disclosed for generating PDT test vectors are equally applicable to paths having test coverage from the first set of PDT test vectors. That is, the present invention can generate a PDT for any path in a circuit design with one or more scan enhanced sequential logic elements. As such, it generation of the first set of PDT test vectors using the test points or test nodes can be optional.

What is claimed is:

1. A method for generating one or more test vectors, the method comprising the steps of,
   performing a functional test on a path selected from a representation of a circuit design, said selected path having a primary input node and a primary output node;
   performing a structural test on the selected path to detect a functional test state of the primary output node of the selected path; and
   generating a path delay test vector capable of providing path delay fault coverage for the selected path based on the detected state of the primary output node.

2. The method of claim 1 further comprising the step of performing path delay testing on the representation of the circuit design to identify one or more paths having undetected path delay faults.

3. The method of claim 2 further comprising the step of halting execution of the functional test at a node representative of the primary input node of the selected path.

4. The method of claim 3 further comprising the step of stepping execution of the functional test back one clock cycle after halting the execution of the functional test at the node representative of the primary input node of the selected path.

5. The method of claim 4 further comprising the step of performing the structural test on the selected path to extract selected path state information one clock cycle before halting execution of the functional test.

6. The method of claim 5 further comprising the step of performing the structural test on the selected path to extract selected path state information after halting execution of the functional test.

7. The method of claim 1 further comprising the step of selecting the functional test to perform, wherein the functional test simulates the functional operation of the selected path.

8. A system capable of simulating an operation of a logic circuit, the system comprising,
   a display device for viewing by a user;
   an input device for use by the user; and
   a test vector generation facility for generating test vectors for testing an electrical characteristic of the logic circuit, the test vector generation facility being capable of determining one or more paths from a start point to an end point of the logic circuit having time dependent test coverage and one or more paths from a start point to an end point of the logic circuit having undetected path delay faults, and generating test vectors for testing the electrical characteristic of at least one of the paths from the start point to the end point of the logic circuit having undetected path delay faults.

9. The system of claim 8 further comprises a simulation facility for simulating functional operation of the logic circuit, the simulation facility being capable of simulating a functional operation of at least one of the one or more paths from the start point to the end point of the logic circuit having undetected path delay faults to cooperatively identify to the test vector generation facility the start point and the end point of the at least one path having undetected path delay faults to allow the test vector generation facility to generate test vectors for the identified path.

10. The system of claim 8 further comprises a storage device in communication with a computational device of the system for holding a representation of the one or more paths.

11. The system of claim 10, wherein the storage device is remote from the computational device and is associated with a network.

12. The system of claim 10, wherein the representation of the logic circuit comprises data and operations associated with the data.

13. The system of claim 12, wherein the data and the operations associated with the data comprises an instance of an object class.

14. A computer readable medium holding computer readable instructions for performing a method for generating one or more test vectors, the method comprising the steps of,
   executing a functional test on a path selected from a representation of a circuit design, said selected path having a primary input node and a primary output node;
   executing a structural test on the selected path to detect a functional test state of the primary output node of the selected path; and
   generating a path delay test vector capable of providing path delay fault coverage for the selected path based on the detected state of the primary output node.

15. The medium of claim 14 further comprising the step of executing a plurality of path delay tests on the representation of the circuit design to identify one or more paths having undetected path delay faults.

16. The medium of claim 14 further comprising the step of halting execution of the functional test at a node representative of the primary input node of the selected path.

17. The medium of claim 16 further comprising the step of stepping execution of the functional test back one clock cycle after halting the execution of the functional test at the node representative of the primary input node of the selected path.

18. The medium of claim 14 further comprising the step of performing the structural test on the selected path to extract selected path state information one clock cycle before halting execution of the functional test.

19. The medium of claim 18 further comprising the step of performing the structural test on the selected path to extract selected path state information after halting execution of the functional test.

20. The medium of claim 14 further comprising the step of selecting the functional test to perform, wherein the functional test simulates the functional operation of the selected path.

* * * * *

UNITED STATES PATENT AND TRADEMARK OFFICE
CERTIFICATE OF CORRECTION

PATENT NO.      : 7,640,476 B2                                          Page 1 of 1
APPLICATION NO. : 11/525659
DATED           : December 29, 2009
INVENTOR(S)     : Watkins et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 487 days.

Signed and Sealed this

Twenty-first Day of December, 2010

David J. Kappos
*Director of the United States Patent and Trademark Office*